(12) United States Patent
Leung

(10) Patent No.: US 6,950,052 B2
(45) Date of Patent: Sep. 27, 2005

(54) NOISE CANCELLATION IN A SINGLE ENDED SAR CONVERTER

(75) Inventor: Ka Y. Leung, Austin, TX (US)

(73) Assignee: Silicon Labs CP, Inc., Austin, TX (US)

(*) Notice: Subject to any disclaimer, the term of this patent is extended or adjusted under 35 U.S.C. 154(b) by 0 days.

(21) Appl. No.: 10/735,163

(22) Filed: Dec. 12, 2003

(65) Prior Publication Data

US 2004/0246163 A1 Dec. 9, 2004

Related U.S. Application Data

(63) Continuation-in-part of application No. 10/453,369, filed on Jun. 3, 2003.

(51) Int. Cl.[7] ............................. H03M 1/12; H03M 1/34
(52) U.S. Cl. ....................................... 341/172; 341/163
(58) Field of Search ............................... 341/118, 120, 341/144, 155, 172, 163; 330/9

(56) References Cited

U.S. PATENT DOCUMENTS

| | | | |
|---|---|---|---|
| 4,399,426 A | | 8/1983 | Tan |
| 4,831,381 A | * | 5/1989 | Hester .......................... 341/172 |
| 5,235,333 A | * | 8/1993 | Naylor et al. ................ 341/118 |
| 5,361,037 A | * | 11/1994 | Qui ................................ 330/9 |
| 5,581,252 A | | 12/1996 | Thomas |
| 5,684,487 A | | 11/1997 | Timko |
| 6,124,818 A | | 9/2000 | Thomas et al. |
| 6,400,302 B1 | | 6/2002 | Amazeen et al. |
| 6,433,724 B1 | * | 8/2002 | Confalonieri et al. ........ 341/155 |
| 6,456,220 B1 | | 9/2002 | Leung et al. |
| 6,538,594 B1 | | 3/2003 | Somayajula |
| 6,559,789 B1 | | 5/2003 | Somayajula |
| 6,587,066 B1 | | 7/2003 | Koyama |
| 6,600,437 B1 | | 7/2003 | Confalonieri et al. |
| 6,603,415 B1 | | 8/2003 | Somayajula |
| 6,667,707 B2 | | 12/2003 | Mueck et al. |
| 6,720,903 B2 | | 4/2004 | Confalonieri et al. |
| 6,724,248 B2 | * | 4/2004 | Llewellyn ........................ 330/9 |
| 6,747,589 B2 | | 6/2004 | Srinivasan et al. |

* cited by examiner

*Primary Examiner*—Patrick Wamsley
(74) *Attorney, Agent, or Firm*—Howison & Arnott, L.L.P.

(57) ABSTRACT

Noise cancellation in a single ended SAR converter. A single ended SAR converter front end is disclosed with common mode driver noise cancellation. The SAR converter front end includes a differential amplifier having positive and negative inputs and an output. A switched capacitor array is provided that is operable in a SAR data conversion operation to vary the voltage on one of the positive or negative inputs of the differential amplifier. A common mode driver drives a common mode node with a low impedance common mode voltage signal to a common mode node, and switching circuitry then switches the common mode voltage signal on the common mode node to the positive and negative inputs of the differential amplifier during a portion of a SAR data conversion cycle. A capacitor reference circuit is attached to the other of the positive or negative inputs of the differential, amplifier during at least the portion of the SAR data conversion cycle, the capacitor reference circuit and the capacitor array during at least the portion of the SAR data conversion cycle having relative capacitance values that increase the common mode rejection of any noise introduced to the common mode node at the input of the differential amplifier.

8 Claims, 8 Drawing Sheets

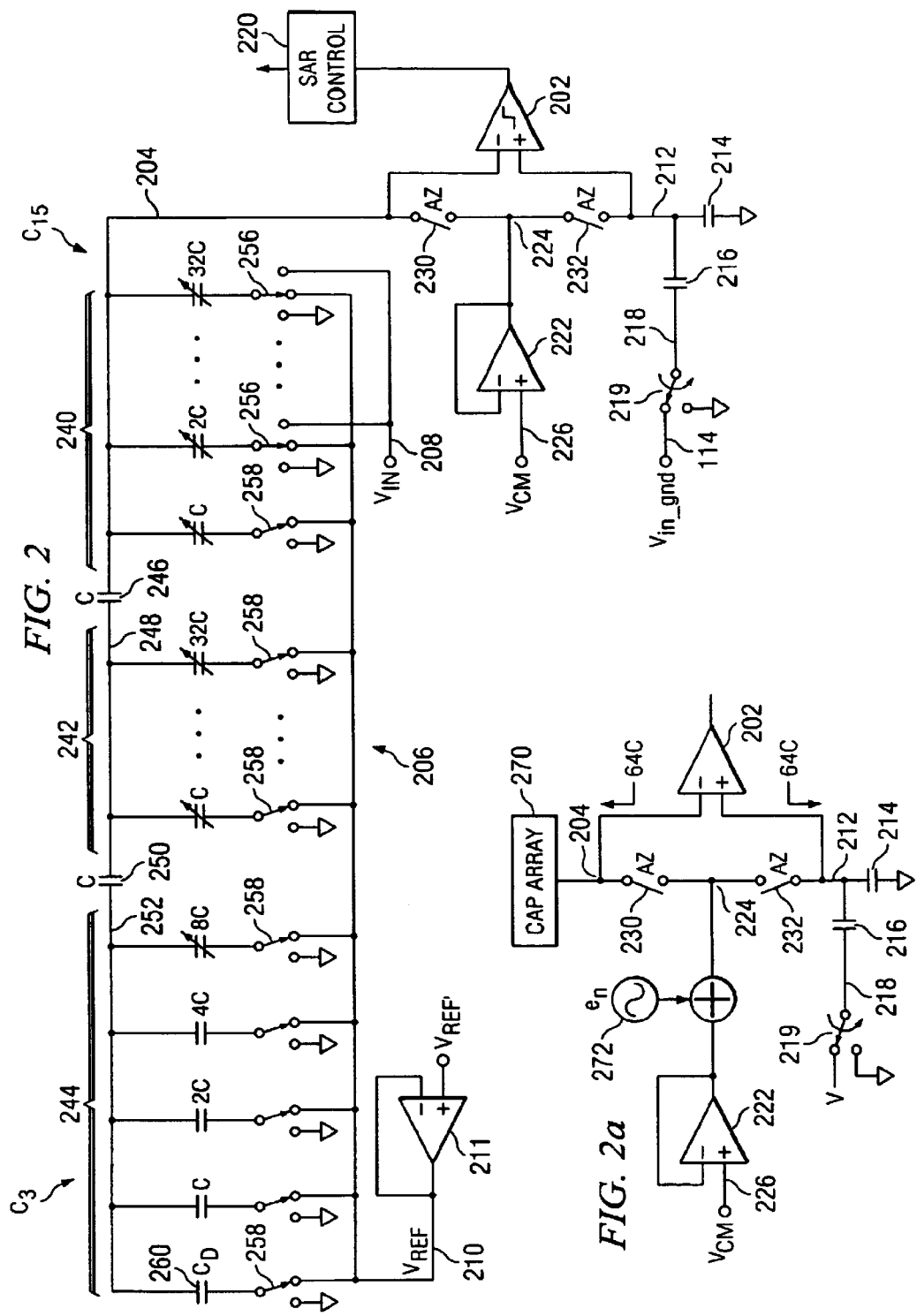

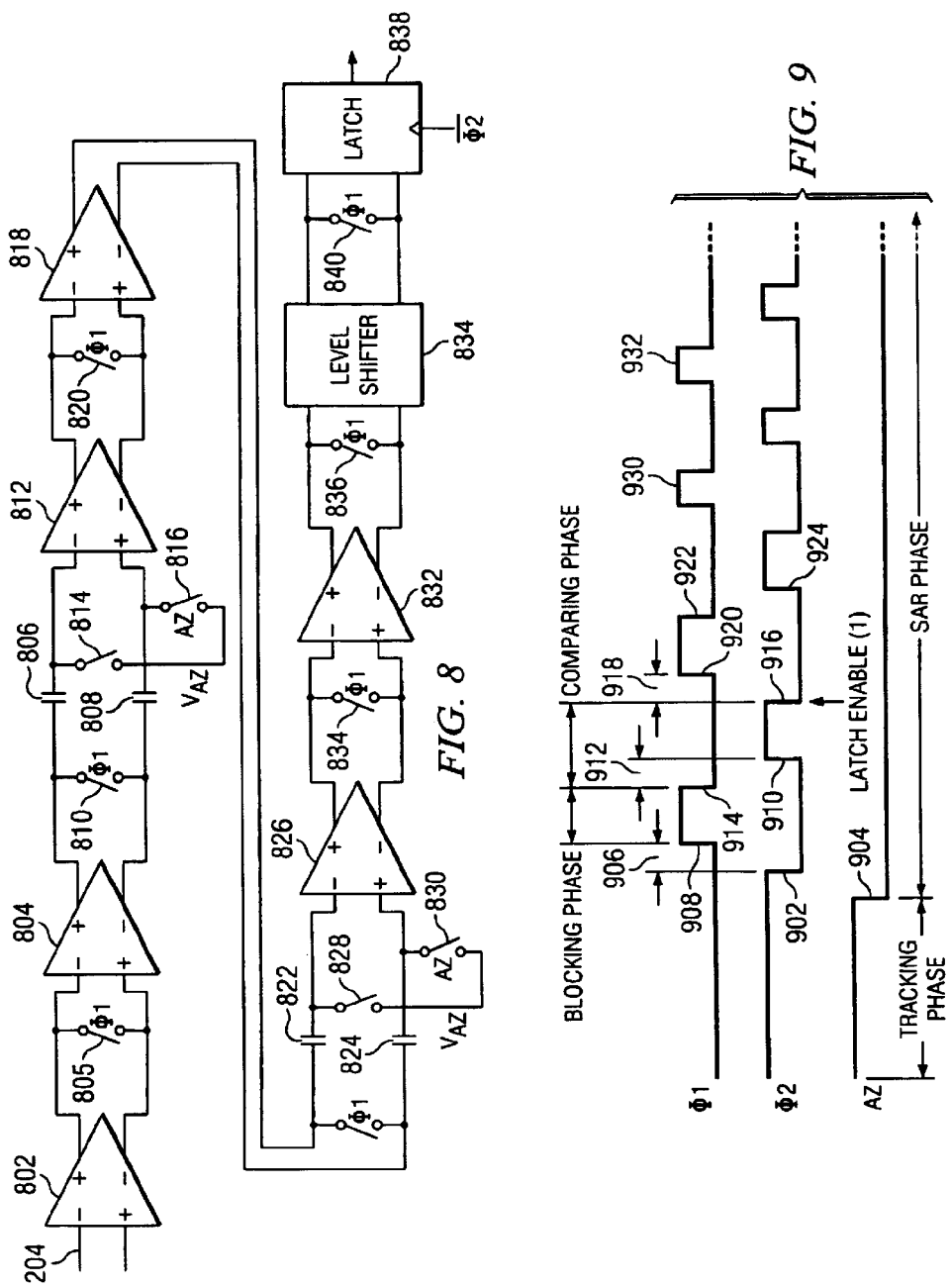

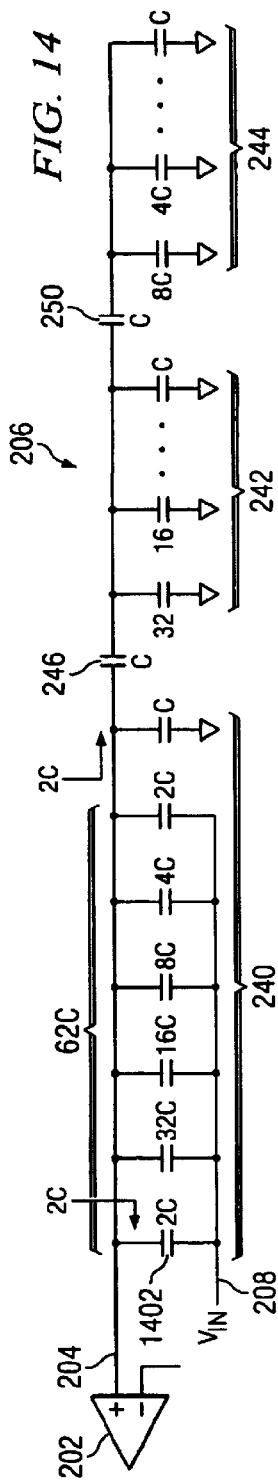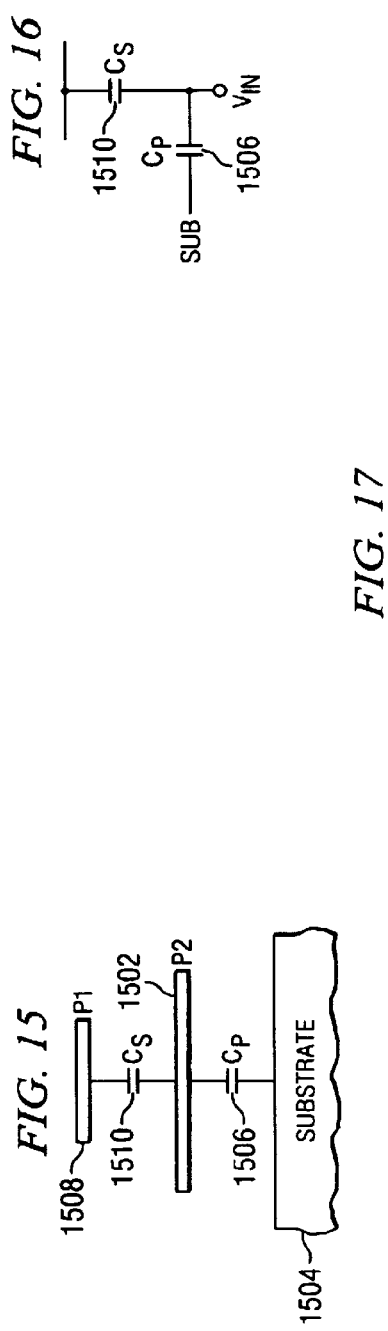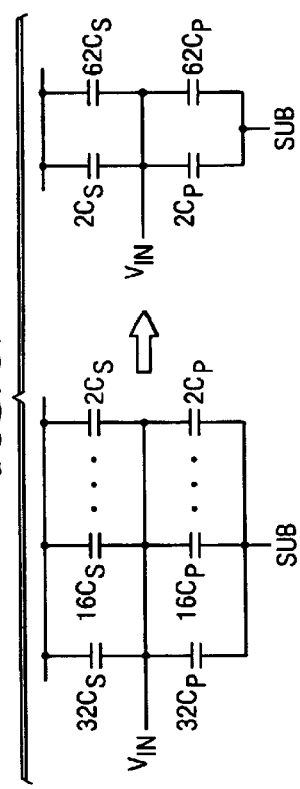

NOISE CANCELLATION IN A SINGLE ENDED SAR CONVERTER

CROSS REFERENCE TO RELATED APPLICATIONS

This application is Continuation-in-Part of U.S. patent application Ser. No. 10/453,369, filed Jun. 3, 2003, and entitled "SAR ANALOG-TO-DIGITAL CONVERTER WITH TWO SINGLE ENDED INPUTS," and is related to co-pending application Ser. No. 10/734,854 entitled "OPEN LOOP COMMON MODE DRIVER FOR SWITCHED CAPACITOR INPUT TO SAR," and co-pending application Ser. No. 10/734,890 entitled "SAR DATA CONVERTER WITH UNEQUAL CLOCK PULSES FOR MSBS TO ALLOW FOR SETTLING," and co-pending application Ser. No. 10/735,164 entitled "HIGH SPEED COMPARATOR WITH BLOCKING SWITCHES FOR SAR CONVERTER," and co-pending application Ser. No. 10/735,387 entitled "COMMON CENTROID LAYOUT FOR PARALLEL RESISTORS IN AN AMPLIFIER WITH MATCHED AC PERFORMANCE," all co-pending applications being Continuation-in-Part applications of U.S. patent application Ser. No. 10/453,369, filed Jun. 3, 2003, entitled "SAR ANALOG-TO-DIGITAL CONVERTER WITH TWO SINGLE ENDED INPUTS."

TECHNICAL FIELD OF THE INVENTION

The present invention pertains in general to data converters and, more particularly, to analog-to-digital converters.

BACKGROUND OF THE INVENTION

Data converters are provided for receiving either an analog signal for conversion to a digital signal or a digital signal for conversion to analog signal. For conversion of analog signals to digital signals, an analog-to-digital converter is utilized. This is typically facilitated by sampling an analog voltage onto a capacitor array having a plurality of binary weighted capacitors. The capacitors then have the ability to have one plate thereof selectively switched between a reference voltage and ground to redistribute the charge among the capacitors, the switching done in a sequential manner in accordance with a successive approximation algorithm. By selectively switching the plates of the capacitors, and comparing the other plate of the capacitors, which is connected to a common input of a comparator, to a reference voltage, a digital value for the analog voltage sampled at the input can be determined.

A number of problems exist with the data conversion of an analog signal to a digital signal. Some of these problems reside in the various offsets of the inputs to the comparators, one of which is due to the fact that the actual chip ground may be different from the input ground at the PC board on which the actual chip is disposed. Additionally, the capacitors in the capacitor array are weighted and can have errors associated therewith. These errors can be accounted for by actually calibrating each of the capacitors with a sub-capacitor array. However, this calibration must be done at each power up of the A/D convertor. Additionally, these capacitor arrays can also have various parasitics associated therewith that effect the operation thereof and require the driving voltage to drive a higher capacitance value than that associated with the capacitance array.

When the capacitor arrays are operated in accordance with a data conversion algorithm such as a SAR algorithm, during the sampling period, the output node of the capacitor array is typically connected to an input of an amplifier and that input connected to a reference voltage. When operating in conjunction with a differential input amplifier, typically both input nodes thereof are switched to a common mode voltage during the sampling or tracking phase where the input voltage is impressed across the switched capacitors and then switched to the capacitor array thereafter. However, it is important when operating with a single array that noise introduction by the voltage source driving the common mode node or reference node for each of the inputs is cancelled. Unless these are balanced, there will be a noise contribution due to this reference voltage circuit.

During the operation of the data conversion, the capacitors disposed in the capacitor array will have various voltages switched thereto. One of these voltages is a common-mode reference voltage. Typically, this reference voltage is generated from an external supply to the array, this typically being generated on-chip, and is a high impedance driving signal. Therefore, it is not capable of driving a low impedance circuit. To facilitate driving the capacitor array to the common-mode reference voltage level, a high-current driver will be provided in the form of an amplifier. These are typically operated with a reference voltage at the common mode level. However, the operation of the amplifier can be affected by the capacitive loading of the common mode amplifier.

SUMMARY OF THE INVENTION

The present invention described and claimed herein, in one aspect thereof, comprises a single ended SAR converter front end with common mode driver noise cancellation. The SAR converter front end includes a differential amplifier having positive and negative inputs and an output. A switched capacitor array is provided that is operable in a SAR data conversion operation to vary the voltage on one of the positive or negative inputs of the differential amplifier. A common mode driver drives a common mode node with a low impedance common mode voltage signal to a common mode node, and switching circuitry then switches the common mode voltage signal on the common mode node to the positive and negative inputs of the differential amplifier during a portion of a SAR data conversion cycle. A capacitor reference circuit is attached to the other of the positive or negative inputs of the differential amplifier during at least the portion of the SAR data conversion cycle, the capacitor reference circuit and the capacitor array during at least the portion of the SAR data conversion cycle having relative capacitance values that increase the common mode rejection of any noise introduced to the common mode node at the input of the differential amplifier.

BRIEF DESCRIPTION OF THE DRAWINGS

For a more complete understanding of the present invention and the advantages thereof, reference is now made to the following description taken in conjunction with the accompanying Drawings in which:

FIG. 2 illustrates an overall diagrammatic view of the pseudo differential ADC of the present disclosure;

FIG. 2a illustrates a detailed schematic diagram of the common mode driver interface;

FIG. 8 illustrates a diagrammatic view of the comparator/ gain stage and latch;

FIG. 9 illustrates a timing diagram for the latching/ comparing operation;

FIG. 14 illustrates a diagrammatic view of the capacitor array illustrating the sampling operation of the input voltage;

FIG. 15 illustrates a cross-sectional view of a capacitor fabricated on a substrate;

FIG. 16 illustrates a schematic diagram of a single sampling capacitor illustrating the association with its parasitic capacitance;

FIG. 17 illustrates a schematic diagram of the use of external compensating parasitic capacitance in accordance with the embodiment of FIG. 14;

DETAILED DESCRIPTION OF THE INVENTION

Figure 1:
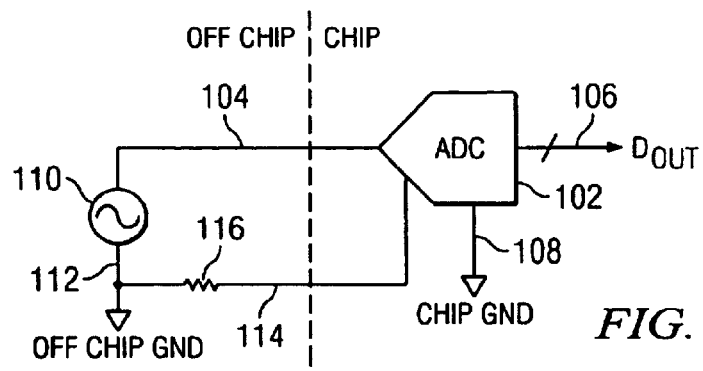
FIG. 1 illustrates an overall diagrammatic view of an ADC illustrated as interfaced with an external input voltage source and ground.

Referring now to FIG. 1, there is illustrated a diagrammatic view of an analog-to-digital convertor (ADC) 102 that is represented by a conventional ADC symbol. This ADC 102 has an analog input 104 and a digital output 106. Additionally, it is noted that ADC 102 is typically fabricated on a chip or on a PC board. Associated with the ADC 102 is a chip ground 108 that is the ground connection to the ADC 102 in proximity thereto. However, the input voltage on line 104 typically is derived from some type of external voltage source 110. Associated with that voltage source 110 is an off chip ground 112 or an off board ground. This ground is typically connected to the ADC 102 through a ground line 114, this ground line 114 having associated therewith a finite resistivity or resistance 116. As such, the voltage of the off chip ground 112 may actually be different than the chip ground 108. As will be described hereinbelow, this resistance offset in the voltage between the off chip ground input and the signal input on line 104 will be accounted for.

Referring now to FIG. 2, there is illustrated a schematic diagram of the overall ADC. The ADC is comprised of a comparator section 202 having a positive and a negative input. The negative input is connected to a node 204, which node is connected to a capacitor array 206. The capacitor array, in accordance with a conventional successive approximation algorithm, will have one plate of the capacitors associated therewith connected to an input voltage on an input node 208 or a reference voltage on a node 210 or ground, as will be described in more detail herein below. The reference voltage on node 210 is provided by a reference voltage driver 211 that is operable to receive an input reference voltage $V_{ref}'$ on a positive input, driver 211 having a negative input connected to the output thereof, the output connected to node 210 to provide a voltage $V_{ref}$.

The positive input of the comparator 202 is connected to a node 212, which node 212 is typically, in a single ended operation, connected to ground. However, in the present disclosure, the node 212 is connected to one side of a first capacitor 214, the other side of capacitor 214 connected to ground. Node 212 is also connected to one side of a series or sampling capacitor 216, the other side thereof connected to a switching node 218. Switching node 218 is either switched with a switch 219 to ground or to the voltage input ground on the node 114, this being the ground from the external voltage source 110.

The output of the comparator 202 is connected to a successive approximation register (SAR) control block 220 which is operable to execute the successive approximation algorithm. As is well known in the art, the successive approximation register is operable to first sample the input voltage across all of the capacitors in the capacitor array which, in the present embodiment as will be described hereinbelow actually only provides for sampling the input voltage over only a portion of the capacitors. However, conventional SAR algorithms will sample the input voltage across all of the capacitors. After this, select ones of the capacitors have the bottom plates thereof connected to ground and select ones of the capacitors have the bottom plates thereof connected to the reference voltage node 210 in a predetermined order. This causes redistribution of charge which changes the voltage on node 204. This is compared with a reference voltage and, if the voltage on node 204 is above the reference voltage, then this capacitor has the bottom plate thereof returned to ground. However, if the voltage on node 204 does not rise above the reference voltage, then the voltage from the bottom plate of this capacitor remains at the reference node voltage on node 210. This is a successive operation which sequentially steps through each of the capacitors from the most significant or largest capacitor to the least significant or smallest capacitor. Again, this SAR operation is conventional.

In order to set a reference voltage on node 204, a common mode voltage driver 222 is provided that is operable to drive a node 224, a low impedance, with a common mode voltage, $V_{CM}$, on an input node 226, a high impedance node. The common mode voltage driver 222 comprises a voltage driver having a positive input connected to node 226 and a negative input connected to the output thereof, the output connected to node 224. This is a non-inverting driver. Node 224 is connected via an auto-zero switch 230 to node 204 and via an auto-zero switch 232 to node 212. When the input voltage on node 208 is sampled onto the capacitor array 206, switches 230 and 232, and switch 219, are configured such that $V_{CM}$ is connected to nodes 204 and 212, and switch 219 is connected to node 114 such that the input voltage ground is connected to node 218 and sampled onto the lower plate of the capacitor 216. After sampling the input voltage, switches 230 and 232 are opened and switch 219 is connected to on-chip ground. Since the on-chip ground may be different than the ground reference associated with the input voltage, the input voltage ground, the voltage between $V_{IN}$ and on-chip ground may not equal the voltage between the input voltage $V_{IN}$ and $V_{IN-GND}$. With the operation of the switch 219, this effectively provides an offset at node 212 proportional to the difference between the on-chip ground and the off-chip ground, $V_{IN-GND}$, the proportionality value defined by the values of the capacitors 214 and 216. For example, if the common mode voltage is $V_{CM}$, then the difference between on-chip and off-chip ground, $V_{IN\text{-}GND}$, will be multiplied by $C_{216}/(C_{216}+C_{214})$ and added to the node 212. This is referred to a pseudo-differential operation.

The capacitor array is configured as a bridge capacitor array. The bridge capacitor array, in this embodiment, is associated with a 16-bit SAR ADC. This is configured with a bridge capacitor array with three capacitor sections, a capacitor section 240, a capacitor section 242 and a capacitor section 244. Capacitor section 240 is comprised of a plurality of capacitors each having the upper plate thereof connected directly to node 204 and the bottom plates of each of the capacitors in section 240 connected to switched nodes. Capacitor section 240 at node 204 is connected to one side of a series capacitor 246, the other side thereof connected to a node 248. Node 248 is connected to the top plates of a plurality of capacitors associated with capacitor section 242, the bottom plates thereof each connected to individual switched nodes. Node 248 is connected to one side of a series capacitor 250, the other side thereof connected to a node 252 associated with capacitor section 244. Node 252 is connected to the top plates of each of the capacitors in capacitor section 244, the bottom plates of each of the capacitors in capacitor section 244 connected to individual switched nodes.

As will be described in more detail herein below, the capacitors in section 240 range from a high value to a low value. Capacitors are referred to in relationship to a common unitary value "C" that represents a unit capacitance value. The capacitor section 240 has capacitors that are binary weighted and range in value from C to 32C. Each of the capacitors is noted as being calibratable, i.e., each can have the value thereof varied. The binary weighting will result in capacitors arranged in the following sequence: C, 2C, 8C, 16C and 32C. In this embodiment, only the capacitors 2C, 4C, 8C, 16C and 32C have the input voltage sampled thereacross. Therefore, each of the capacitors from 2C through 32C have the bottom plate thereof connected to a switch 256 that can switch between ground, the $V_{ref}$ node and the $V_{in}$ node 208. Thus, $V_{in}$ on node 208 can be sampled across the capacitors from 2C to 32C for capacitor section 240. The capacitor C has the bottom plate thereof connected to a switch 258 that can only be switched between ground and the $V_{ref}$ node 210.

In capacitor section 242, the capacitors range in a binary weighting succession from C through 32C, each of the capacitors therein having the top plate thereof connected to node 248 and the bottom plate thereof connected to an associated switch 258 which, as described hereinabove, can only be connected between ground and the $V_{ref}$ node 210. Capacitor section 244 has binary weighted capacitors that range from C through 8C and a dummy capacitor 260 that has the value of C. The capacitors in section 244 have the top plate thereof connected to node 252 and the bottom plate thereof connected to an associated switch 258 for each capacitor therein that can be connected to ground and the $V_{ref}$ node 210. The operation of the SAR control will be described hereinbelow with respect to the operation thereof. In addition, although not shown, there is an additional parasitic capacitor that will have the operation thereof described hereinbelow.

Referring now to FIG. 2a, there is illustrated a detailed schematic diagram of the interface of the common mode driver 222 with the inputs to the comparator 202. As noted hereinabove, this is configured as a single ended operation which, in the normal prior art operation, would have one side thereof connected to a fixed voltage such as $V_{CM}$. In that operation, the common mode driver would typically provide the common mode voltage to the negative input on node 204 to apply the common mode voltage to the node 204 during the sampling operation. However, as noted hereinabove, there are provided two switches 230 and 232, which connect the common mode input to both the negative input and the positive input on nodes 204 and 212, respectively. On the reference node, the positive input of the comparator 202, the capacitors 216 and 214 are provided which, in combination, provide a "fixed" capacitance that is substantially equal to the capacitance of the capacitor array, represented by a block 270. The common mode driver, as noted herein, has a high input impedance on the positive input on node 226, and the output on node 224 is a low impedance driver. Inherent to the operation of this common mode driver 222 is the introduction of noise into the output, this represented by a noise generator 272 that is summed with the output of the driver 222. If the output of the common mode driver were only sampled onto the node 204 during the conversion operation, then the noise of the common mode driver would be added to the negative input and there would be no rejection thereof on the input to the comparator 202 and this noise would then be amplified and output on the output thereof. If it was sampled onto the positive input on node 212 and there were no capacitor configuration to sample an input voltage, i.e., there were no switched capacitor structure associated therewith, then this noise could be disposed on that node. However, with the architecture set forth in FIG. 2a, the use of a capacitor structure on the positive input node, i.e., the reference node, that is substantially equal to that of the capacitor array 270, sampling of the noise on the two substantially identical structures will result in cancellation of the noise from the noise generator 272 through the common mode rejection associated with the input of the comparator 202. If the capacitance is not equal, then this will result in an increase in the noise.

Figure 3:
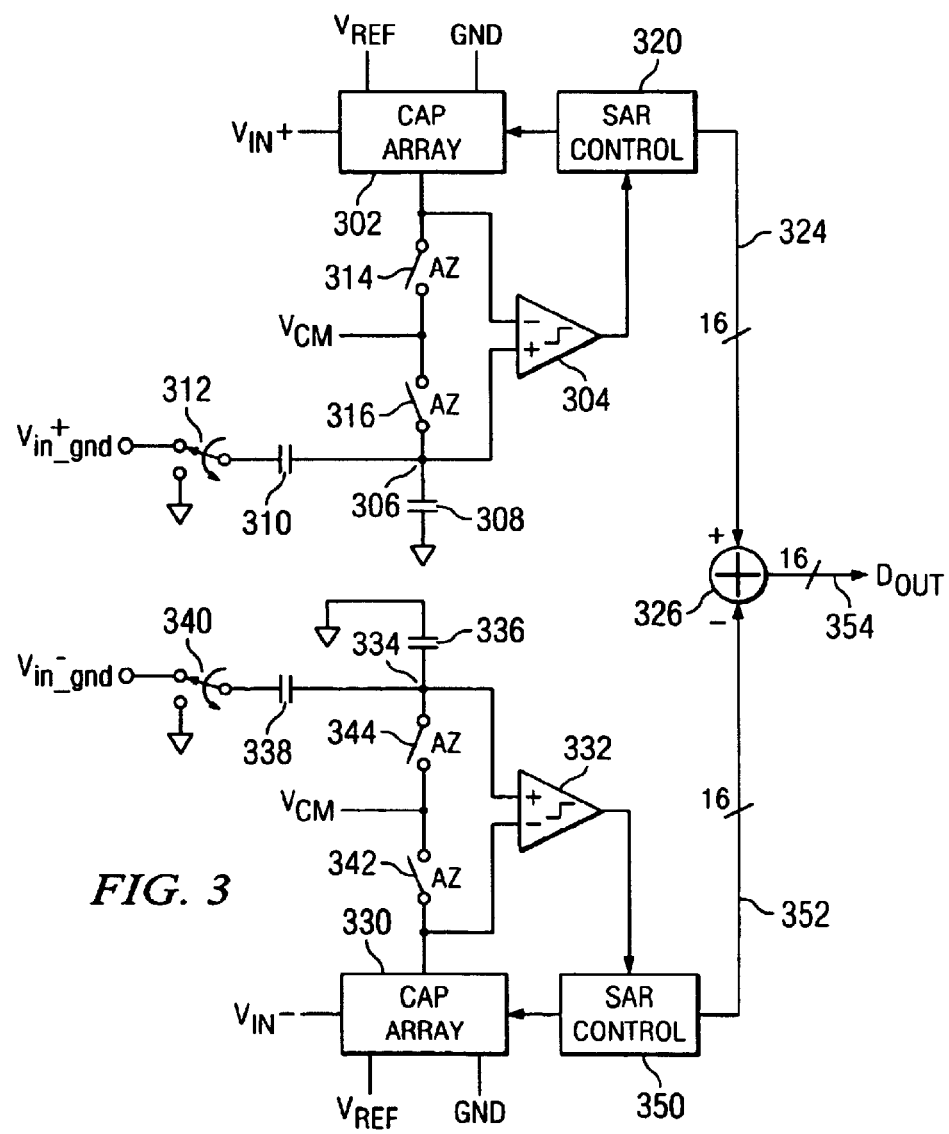
FIG. 3 illustrates a higher level view of the embodiment of FIG. 2 showing a differential input.

Referring now to FIG. 3, there is illustrated a diagrammatic view of a differential configuration utilizing two pseudo-differential SAR configurations. A positive input voltage $V^+_{IN}$ is connected to the input of a capacitor array 302 associated with a comparator 304 and having the output thereof connected to the SAR control 320. The positive input is connected to a node 306, node 306 connected to one side of a capacitor 308, the other side thereof connected to ground and also connected to one side of a sampling capacitor 310, the other side thereof connected to a switch 312 that is operable to be connected to either the off chip input ground, $V^+_{IN\text{-}GND}$, or on chip ground. The negative and positive inputs of the comparator 304 are connected to one side of respective switches 314 and 316 for selectively connecting the inputs to a common mode of voltage. Associated with comparator 304 is a SAR control 320 that is operable to perform the successive approximation operation on the capacitor array 302, the capacitor array 302, as described hereinabove with reference to FIG. 2, operable to be connected to either the input voltage $V_{IN}^+$, ground or the reference voltage. The output of the SAR control 320 is connected through a 16-bit bus 324 to a subtraction circuit 326.

The negative input to the overall ADC is provided with a negative input voltage $V^-_{in}$ which is connected to the input of a capacitor array 330, similar to capacitor array 302. Capacitor array 330 is connected to the negative input of a comparator 332, the positive input thereof connected to a node 334. Node 334 is connected through to one side of a capacitor 336, the other side thereof connected to ground and also to one side of a sampling capacitor 338, the other side thereof connected to a switch 340, switch 340 operable to be connected to an on-chip ground or off chip ground, $V^-_{IN\text{-}GND}$. It should be noted that $V^+_{IN\text{-}GND}$ and $V^-_{IN\text{-}GND}$ could be separate voltages to which $V^+_{IN}$ and $V^-_{IN}$ are referenced to or separate ground voltages. Comparator 332 also has the positive and negative inputs thereof connected to respective switches 342 and 344 for selective connection to a common mode voltage $V_{CM}$. The output of comparator 332 is connected to a SAR control block 350 that is operable to perform the successive approximation algorithm in association with the capacitor array 330, as described hereinabove. Capacitor array 330, in addition to receiving as an input of the negative input voltage, also is operable to be connected to either the reference voltage or ground. The output of SAR control 350 is connected to a 16-bit bus 352, which is connected to the negative input of the subtraction circuitry 326. Subtraction circuitry 326 is operable to take the difference between the determined values after the SAR conversion operation and provide a data output on a 16-bit bus 354 that represents the differential voltage value. It should be noted that either of the comparators 304 or 332 could be configured in an inverting configuration such that the subtraction circuit 326 would be an addition circuit, the result of either configuration representing the difference between the digital representations of $V^+_{IN}$ and $V^-_{IN}$.

Figure 4:
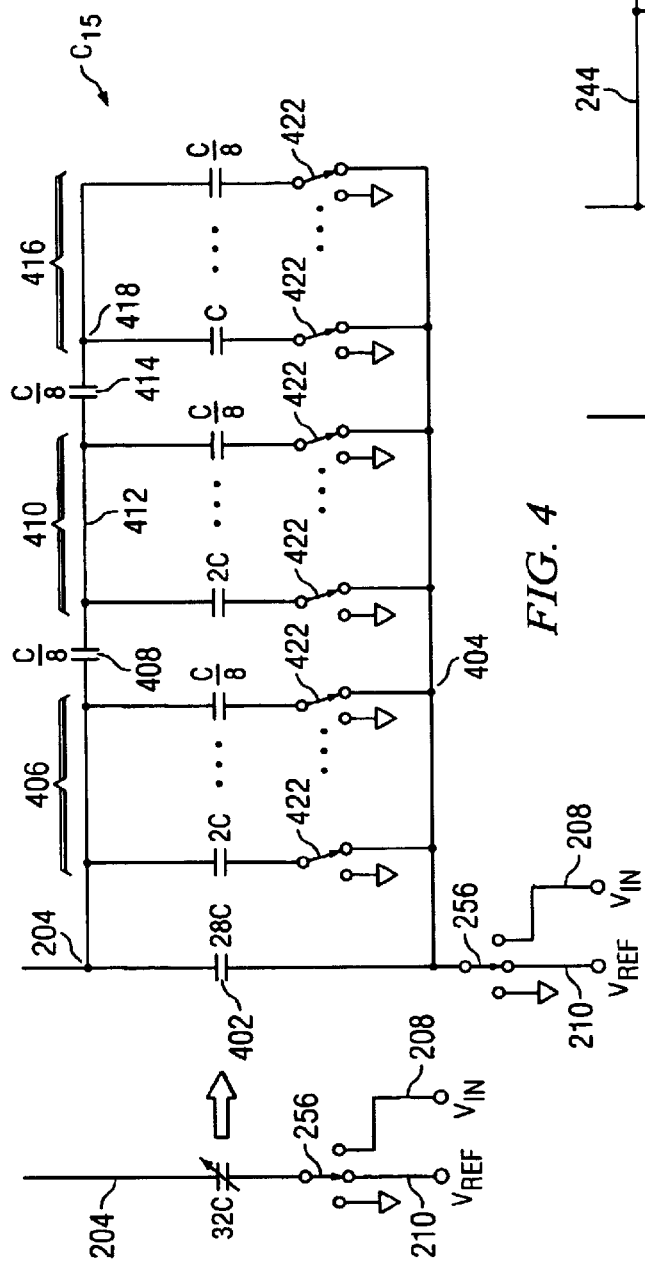
FIGS. 4 and 5 illustrate details of the sub arrays utilized to calibrate each of the capacitors in the capacitor array.

Referring now to FIG. 4, there is illustrated a detail of one of the calibratable capacitors in the capacitor section 240, this being the 32C capacitor therein. This, as described hereinabove, is a calibratable capacitor that can have the value thereof initially varied. In general, capacitors are initially designed to have a binary relationship to other capacitors, the unit capacitance being a value of "C." However, due to manufacturing variations, the capacitive value can have an error associated therewith. This error can be accounted for by providing parallel calibrating capacitors that can be switched in or out in a calibration operation.

In the embodiment of FIG. 4, the most significant capacitor, the 32C capacitor, is illustrated. This capacitor is connected between node 204, the negative input node to comparator 202, and the switch 256. The switch 256, as described hereinabove, is operable to be switched between ground, the reference voltage node 210 or the $V_{in}$ node 208. For calibration purposes, the 32C capacitor, this being the most significant bit (MSB) capacitor, consists of a fixed value capacitor 402 with a value of 28C that is connected between node 204 and switch 256, switch 256 connected to a node 404. Thus, in order to have a value of 32C, there must be a total of 4C that can be connected in parallel with capacitor 402. Further, for calibration purposes, this capacitance value must be larger than 4C to account for values in the capacitor 402 that are in error and smaller than expected due to manufacturing tolerances. Therefore, the calibrating capacitor array connected in parallel with capacitor 402 ranges from a capacitance value as low as C/8 to a value of 2C. This calibrating capacitor array is a bridge capacitor array. This bridge capacitor array is comprised of three sections, a first section 406 comprised of a plurality of binary weighted capacitors that range in value from the largest capacitor of 2C to a capacitive value of C/8 in the following sequence: 2C, C, C/2, C/4 and C/8. Node 204 associated with the upper plate of the capacitors in capacitor section 406 is connected through a series capacitor 408 to a second capacitor section 410 at a node 412 at the top plate of capacitors ranging from 2C through C/8 in a binary weighted configuration. Capacitor 408 has a value of C/8. Similarly, node 412 is connected through a series capacitor 414 to a third capacitor section 416 on a node 418, node 418 connected to the top plate of a plurality of capacitors ranging in value from C to C/8 in a binary weighted configuration. Capacitor 414 has a value of C/8.

Each of the capacitors in the capacitor sections 406, 410 and 416 has the bottom plate thereof connected to a switch 422, switch 422 operable to connect the bottom plate of the respective capacitor to either the node 404 or to ground. During operation, the input voltage on node 208 is not sampled but, rather, all of the capacitors in the entire capacitor array 206 are connected to ground and the common mode voltage to switch 230 connected to node 204 such that the common mode voltage is applied across all of the capacitors. Thereafter, one of the capacitors, i.e., the 32C capacitor associated with section 240, is then individually calibrated. To facilitate this, the switch 256 associated with a particular capacitor (or the switches 258 for the remaining capacitors for remaining two sections 242 and 244) will be switched only between ground and $V_{ref}$, with $V_{ref}$ selected. The switches 422 will then be successively connected to ground through a SAR algorithm, and then a comparison made to balance this overall capacitance out, which balance will only occur when the calibrated value is a real 32C. The general operation of providing calibrated capacitors is described in U.S. Pat. No. 4,709,225, which is incorporated herein by reference.

Figure 5:
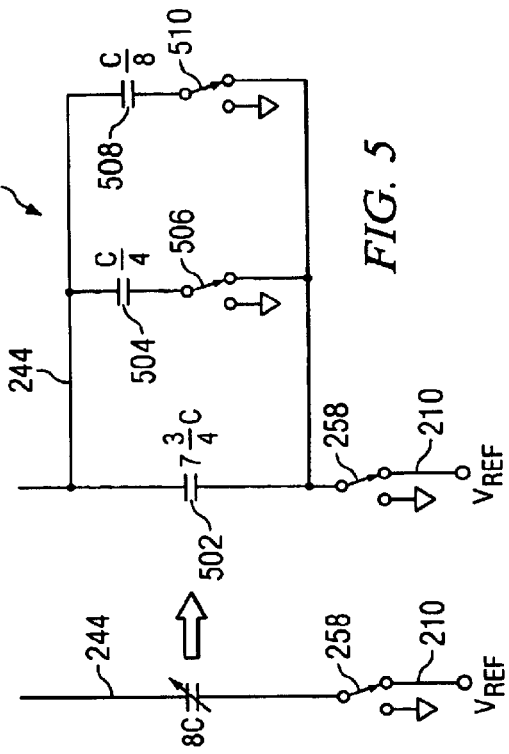

Referring now to FIG. 5, there is illustrated a diagrammatic view for the 8C capacitor in capacitor section 244, which, as described herein above, is connected between node 244 and one side of one of the switches 258. Also, as noted herein above, the 8C capacitor is comprised of a fixed capacitor 502 of a value 7¾C. To calibrate this, there are provided two capacitors, a capacitor 504 connected across capacitor 502 with a value of C/4 which has one side thereof connected to node 244 and the other side thereof connected to a switch 506 that is operable to connect the bottom plate of capacitor 504 to either ground or to the other side of capacitor 502. Similarly, a second calibrating capacitor 508 has the top plate thereof connected to node 244 and the bottom plate thereof connected to one side of a switch 510 that is operable to connect the bottom plate of capacitor 508 to either the other side of capacitor 502 or to ground. The value of capacitor 508 is C/8. This provides a resolution of ⅛ of the unit capacitance value, C. The calibration will proceed as described hereinabove with respect to the embodiment of FIG. 4.

Figure 6:
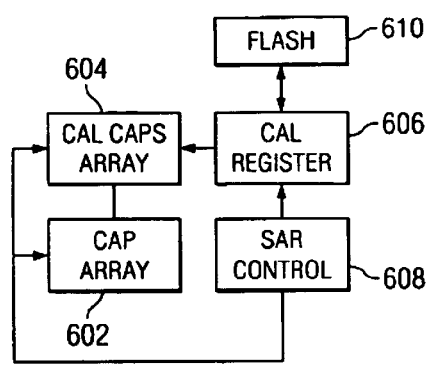
FIG. 6 illustrates the calibration operation and the storage thereof in a flash memory.
Figure 7:
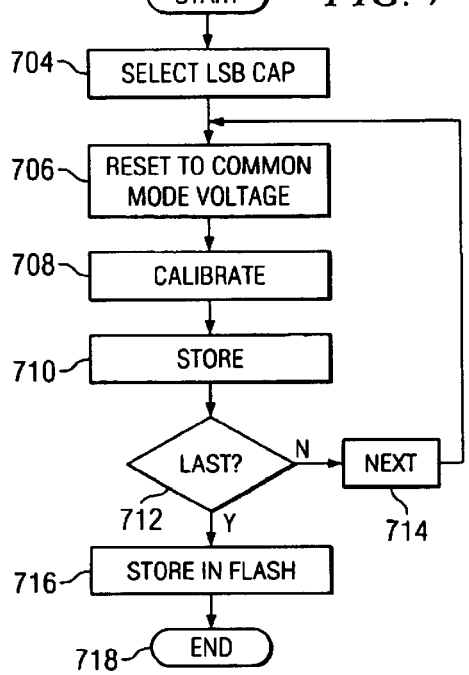
FIG. 7 illustrates a flow chart for the calibration operation.

Referring now to FIG. 6, there is illustrated a diagrammatic view of the calibration operation. Calibration typically occurs on power-up or during production tests. Illustrated in FIG. 6 is a capacitor array 602, which is substantially the capacitor array 206 of FIG. 2. Each of the capacitors in the capacitor array has a calibration capacitor array associated therewith, all of these calibration capacitor arrays represented by block 604. The values of the calibration array switches, i.e., the switches that are connected or disconnected, is set in a calibration register 606. During calibration, a SAR control 608, substantially the same as SAR control 220 of FIG. 2, is operable to control the cap array and the calibration cap array through the calibration register 606 to set the values thereof in the appropriate manner. The SAR control 608 is operable to define these values as described hereinabove. However, once the calibration switch configuration is determined, this information is then stored in a flash memory 610. Therefore, during power up, it is not necessary to go through the calibration operation again; rather, it is only necessary to load the values from flash memory 610. The operation of the embodiment of FIG. 6 is illustrated in a flow chart of FIG. 7, which is initiated at a block 702 and then proceeds to a function block 704 to select the LSB as the least significant bit capacitor for calibration. The program then flows to a function block 706 to reset the input to the comparator 202 at the common mode voltage on the node 204. The program then flows to a function block 708 to calibrate the associated calibration capacitor array associated with that capacitor. The program then flows to a function block 710 to store this value in the calibration register 606 and then to a decision block 712 to determine if this is the last capacitor to be calibrated, i.e., if this is the MSB capacitor. If not, the program flows along the "N" path to a function block 714 to select next capacitor value and then to the input of function block 706 to again reset the comparator 202 at the common mode voltage for calibrating this next capacitor. The program will continue calibrating the capacitors until the last capacitor has been calibrated and then the value of the calibration register 606 stored in flash at a function block 716. This operation is typically done at the manufacturing site when the ADC is placed into a calibration mode. This is facilitated in software and then a command sent, i.e., a Write command, that indicates that the value should be stored. The program then flows to an End block 718.

During operation of the ADC, a power up condition will cause a Read command to be issued to the flash memory 610 to write the values therein to the calibration register 606. However, any nonvolatile memory can be utilized for this purpose and a type of register configuration can be utilized that allows a predetermined set of calibration values to be applied to the calibration arrays associated with this capacitor in a calibration array 206 to accommodate for manufacturing tolerances. Typically, once these manufacturing tolerances have been accounted for, no other changes need be made. This eliminates the need for performing the entire calibration operation at each power up.

Referring now to FIG. 8, there is illustrated a diagrammatic view of the comparator/amplifier. A plurality of stages with a comparator are illustrated, there being six stages, each with approximately 9 dB of gain. There is illustrated a first stage 802, which has a negative and positive input, this basically being the negative and positive input associated with nodes 204 and 212 of FIG. 2. The first stage has positive and negative outputs connected to the negative and positive inputs, respectively, of a second stage 804. Additionally, there is provided a switch across the negative and positive inputs of stage 804. This is controlled by a blocking clock signal $\phi 1$. The positive and negative outputs of amplifier stage 804 are connected to one side of series capacitors 806 and 808, respectively. A blocking switch 810 is connected between the positive and negative outputs of stage 804. The other side of capacitors 806 and 808 are connected to the negative and positive inputs, respectively, of a third stage 812. Additionally, the negative and positive inputs of the third stage 812 are connected through switches 814 and 816, respectively, to an autozero voltage, $V_{AZ}$. These switches 814 and 816 are controlled by an AZ control signal. The positive and negative outputs of the third stage 812 are connected to the negative and positive inputs of a fourth stage 818, with a blocking switch 820 connected between the negative and positive inputs of stage 818 and controlled by $\phi 1$. The positive and negative outputs of the stage 818 are connected through series capacitors 822 and 824, respectively, to the negative and positive inputs of a fifth stage 826. The negative and positive inputs of fifth stage 826 are connected to the voltage $V_{AZ}$ through respective switches 828 and 830, switches 828 and 830 controlled by the AZ control signal. The positive and negative outputs of stage 826 are connected to the negative and positive inputs of a sixth stage 832, a blocking switch 834 connected across the negative and positive inputs thereof and controlled by $\phi 1$. The positive and negative outputs of the sixth stage 832 are connected to the input of a level shifter 834 with a blocking switch 836 connected across the positive and negative outputs and controlled by $\phi 1$. The output of level shifter 834 is connected to the input of a latch 838, and having a blocking switch 840 connected across a output of level shifter 834 and controlled by $\phi 1$. Latch 838 is controlled by a latch signal $\phi 2$-Bar.

In operation, the switches 814, 816, 824 and 830 are all closed during the sampling phase or the "tracking" phase. This is the phase wherein the input voltage is sampled. This essentially puts a preset bias on the input of third and fifth stages, it being remembered that the first stage 802 will have the common mode bias voltage disposed thereacross during this phase. With reference to FIG. 9, there is illustrated a timing diagram for this operation, wherein it can be seen that the control signal AZ is high during the tracking phase and then falls low during the SAR phase. When the tracking phase is completed, the control signal $\phi 2$ will go low at an edge 902. The autozero signal, AZ, will also go low at edge 904. This will open the switches 230 and 232, such that the input to the first stage 802 is open with the common mode voltage sampled on the negative and positive inputs thereof. Additionally, the switches associated with the inputs to stages 812 and 826 will also be open such that the voltage $V_{AZ}$ will be on positive and negative inputs thereof. During this time, all of the blocking switches will be opened and will not close until a predetermined delay 906 from the falling edge 902 of $\phi 2$. After this amount of delay, all the blocking switches will be closed when $\phi 1$ goes high at an edge 908. This will, in effect, prevent any instabilities from occurring that would result from transitions on the input of any of the stages, by reducing the overall gain of the amplifier chain. At rising edge 908, $\phi 1$ goes high and the first capacitor will be switched, this being the MSB capacitor. This will be switched in, charge redistributed and then a comparison made. From the rising edge 908 of $\phi 1$ to the falling edge 914 of $\phi 2$, this time allows the input node 204 to settle and the amplifier chain to stabilize. From falling edge 914 of $\phi 1$ to falling edge 916 of $\phi 2$, this is the comparing phase of the SAR. At the end of the pulse associated with the rising edge 910, there will be a falling edge 916 that will indicate the end of the comparing phase and it also constitutes a latch enable, i.e., the latch 838 will latch the first bit of the digital value thereof, this constituting the switch setting for the MSB cap. There will be another delay after the falling edge 916, a delay 918 before the next rising edge 920 of $\phi 1$. This delay allows the comparator output value from stage 832 to be latched in the latch 838 and then a decision made as to whether that capacitor should remain connected to $V_{ref}$ or ground during the SAR operation. Again, at rising edge 920 of $\phi 1$, the blocking switches are closed to again reduce the gain of the amplifier chain and the second capacitor will be switched, this being the MSB-1 capacitor. Note that, after rising edge 920 and before a falling edge 922 on $\phi 1$, the blocking phase is again entered and the blocking switches closed to reduce the gain of the amplifier chain. This will set the output of stage 832 to effectively "0" until falling edge 922, wherein the gain will then return to normal and amplify the voltage on the input to stage 802. For example, suppose that prior to rising edge 920, during the comparing phase of the previous SAR operation, that the MSB capacitor was determined to have been left in, i.e., the switch 256 associated with the 32C capacitor in section 240 connected to the V$_{ref}$ node 210. This will result in a voltage on the input to stage 802. The rising edge 920 will allow the input to then seek its correct level and settle prior to a rising edge 924 on φ2, at which time the second bit of the SAR conversion phase would be determined.

The φ1 clock will have the first two pulses defined by rising/falling edges 908/914 and 920/922 with a pulse width of 2× the normal SAR clock pulse width (the SAR clock running at ½ normal rate). Thereafter, the pulse width will be a normal pulse width at a normal SAR clock rate, noted by pulses 930, 932, etc. The reason for this is because the first MSB and the second MSB are the largest capacitor values and the longer pulse width allows more time for settling prior to the comparison phase. However, the pulse width is returned to the 1×SAR clock rate to increase the overall SAR clock rate.

It can be seen that there are two aspects that result in the ability to increase the sampling rate of the SAR converter. The first is the use of the blocking pulse, that being the pulse defined by the rising edge 908 and falling edge 914 and the rising edge 920 and the falling edge 922, and also the use of the uneven SAR clock cycle, wherein the length of a cycle is longer for certain bits and shorter for others. Consider the blocking pulse first. By utilizing the switches 805, 810, 820, 834, 836 and 840, the gain of the comparator can be decreased for a predetermined amount of time at the beginning of each switching operation wherein a capacitor is switched between ground and V$_{REF}$. This is where the largest transient pulse will occur. Since the gain is low and the bus bandwidth is high during the blocking phase, the transient pulse will settle out faster and allow the comparison to be accurately made over a much shorter period of time, after which it is latched into the latch 838 by a falling edge of φ2. Further, each successive operation with a smaller capacitor will have an inherently smaller transient, due to the size of the capacitor and the ability of that capacitor to create a transient on node 204. As such, one embodiment results in the pulse width varying over a SAR cycle. For example, the pulse width between rising edge 908 and falling edge 914 can be greater than the pulse width between rising edge 920 and falling edge 922. Similarly, the pulse width for pulses 930 and 932 can also vary in a decreasing manner. This allows the length of time from the time that the capacitors are switched to the time that they can be latched to the decrease for each successive pulse.

With the use of the uneven clock cycles, without the use of the blocking pulse, the ability to increase the sampling rate of the converter is also facilitated. This is due to the fact that the capacitors will be switched at a time prior to the falling edge 916 of the first φ2 pulse and there must be sufficient time to allow node 204 to settle and for the output of the amplifier 832 to settle. Once these have settled, that will complete the comparison phase at the falling edge 916 of the MSB, for example. Thereafter, the settling time for the next capacitor will be less, due to the size of the capacitor. This will decrease such that the clock cycles are uneven. As illustrated in FIG. 9, only the first two MSB capacitors are considered. However, the uneven clock cycle could only be a single MSB, the second MSB, or a lower bit. Furthermore, it could be a mixture of bits with different clock cycles such that the first two bits had one clock cycle, the second two bits have a second cycle and so on. Therefore, the settling time can be facilitated with either the blocking pulses or the uneven clock cycle or a combination of both.

Figure 10:
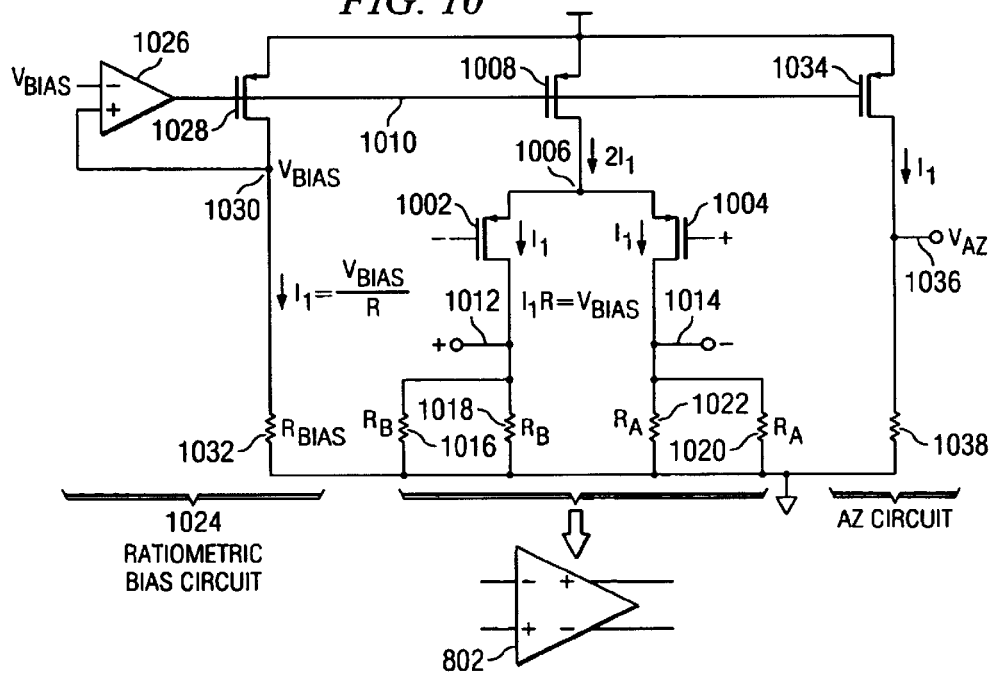
FIG. 10 illustrates a schematic diagram of one stage of amplification and the ratiometric bias circuit associated therewith.

Referring now to FIG. 10, there is illustrated a schematic diagram of one stage of the amplification stage, for example, stage 802. Additionally, there is provided bias circuitry that provides both the voltage, V$_{AZ}$, and a ratiometric bias for both the voltage, V$_{AZ}$, and the stage 802, and subsequently for all of the amplification stages. Each of the amplification stages is comprised generally of a differential pair of p-channel transistors 1002 and 1004 having one side of source-drain paths thereof connected to a node 1006. Node 1006 is connected through the source-drain path of a p-channel transistor 1008 to V$_{dd}$. The gate of transistor 1008 is connected to a bias node 1010. The gate of transistor 1002 is connected to the negative input of the stage 802 and the gate of transistor 1004 is connected to the positive input thereof. The other side of the source-drain path of transistor 1002 is connected to a positive output node 1012 and the other side of the source-drain path of transistor 1004 is connected to a negative output node 1014. Output node 1012 is connected to ground or V$_{ss}$ through two parallel connected resistors 1016 and 1018 and, similarly, a negative output node 1014 is connected to ground through two parallel connected resistors 1020 and 1022.

The bias for transistor 1008 is determined by a ratiometric bias circuit 1024. The bias circuit 1024 is comprised of a voltage driver 1026 having the negative input thereof connected to a bias voltage, V$_{bias}$, the output thereof connected to the gate of a p-channel transistor 1028 having the source-drain path thereof connected between V$_{dd}$ and a bias node 1030. Bias node 1030 is connected to the positive input of the driver 1026 such that the transistor 1028 and driver 1026 provide a voltage follower. The gate of transistor 1034 is connected to node 1010, the source-drain thereof connected between V$_{dd}$ and a node 1036 providing the voltage V$_{AZ}$. Bias node 1030 is connected to ground through a resistor 1032 labeled R$_{bias}$.

In operation, the ratiometric bias circuit 1024 provides a current I, through resistor 1032 wherein the current I$_1$ is equal to V$_{bias}$/R. The resistors 1016, 1018, 1020 and 1022 are sized such that the current through transistor 1008 delivered to node 1006 is equal to 2I$_1$ such that the current through each of the transistors 1002 and 1004 is I$_1$. This results in the fact that the current through each of the resistors 1016, 1018, 1020 and 1022 is I/2 and any variation in the current thorough bias resistor 1032 will be reflected in these resistors 1016–1022. If the value of resistor 1032 increases, the current I$_1$ will decrease both in the bias circuit 1024 and in the stage 802.

In addition to providing bias for the stage 802, the ratiometric bias circuit 1024 also provides bias to determine the voltage V$_{AZ}$. This is provided by driving the gate of a p-channel transistor 1034 with the node 1010. Node 1036 is connected to ground through a resistor 1038, which has essentially the same value as resistor 1032 such that the voltage I$_1$ flows through transistor 1034 and resistor 1038. Therefore, during the tracking phase, the inputs of the first stage 802 and two of the five subsequent stages 812 and 826, have the inputs thereof on transistors 1002 and 1004 connected to a common voltage representing a current balance wherein I$_1$ flows through both of transistors 1002 and 1004.

Figure 11:
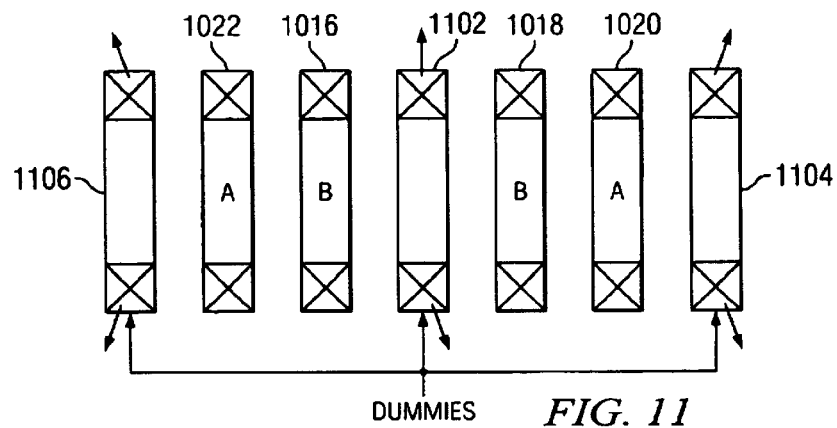
FIG. 11 illustrates a layout of the resistors associated with the amplifier stage.
Figure 12:
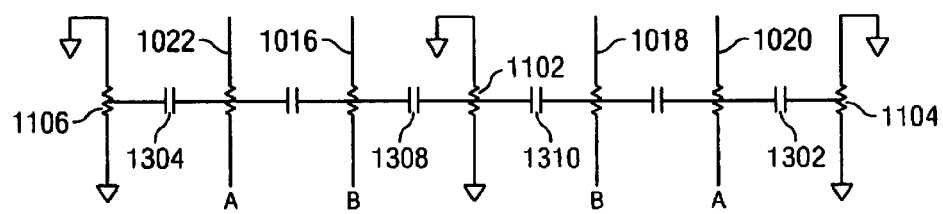
FIG. 12 illustrates a schematic diagram of the resistors illustrating the relationship thereof.
Figure 13:
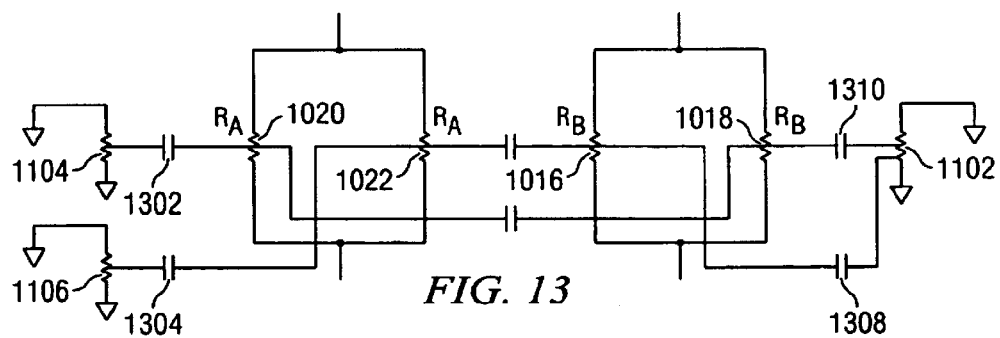
FIG. 13 illustrates an alternate view of the diagram of FIG. 12.

Referring now to FIGS. 11–13, there is illustrated an embodiment relating to the layout of the resistors 1016–1022 to provide a common centroid. The resistors 1016–1022 are fabricated from polycrystalline silicon. This will utilize, during the processing of the semiconductor device for the ADC, the use of one or more layers of polycrystalline silicon (Poly) which can be doped to a predetermined resistivity to provide the appropriate resistance. The resistivity, in addition to the width and length of the "strip" that provides the resistor, will define the value of the resistor.

Referring specifically to FIG. 11, there are illustrated seven resistor strips, all substantially equal. The seven resistor strips are laid out in parallel to each other and comprise the four resistors 1016–1022 with various dummy resistor strips disposed therebetween. In the layout illustrated in FIG. 11, resistors 1016, an $R_b$ resistor and resistor 1022, and $R_a$ resistor, are disposed adjacent to each other, wherein the other $R_a$ resistor 1020 is disposed adjacent to the other $R_b$ resistor 1018. The resistors are laid out, such that resistor 1022 is to the left of resistor 1016, which is to the left of resistor 1018 with a dummy resistor 1102 disposed therebetween. Resistor 1018 is to the left of resistor 1020. Resistor 1020 has a dummy strip 1104 disposed to the right thereof and resistor 1022 has a dummy resistor strip 1106 disposed to the left thereof. Dummy resistor strips 1102, 1104 and 1106 are substantially identical to the resistor strips associated with resistors 1016–1022, with the exception that they are connected to ground.

Referring specifically to FIG. 12, there is illustrated a schematic layout of the resistor strips illustrated in FIG. 11. The dummy resistor strips 1102–1106 are all grounded and it can be seen that the capacitance loading on each of the resistor strips is substantially even. Prior art systems utilize the two dummy strips 1104 and 1106 but not the center dummy strip 1102. The purpose for this layout is to reduce a degradation of the common mode rejection ratio (CMRR). Thus, the capacitive couplings of the resistor strip associated with $R_a$ to $R_b$ or to a dummy resistor strip equals the capacitive coupling of the resistor strip associated with the $R_a$ or the dummy resistor strip. The purpose of coupling each of the resistors to the dummy resistor strips 1104, 1106 and 1102 can be seen in FIG. 13. In prior art systems, only the resistors 1020 and 1022 were coupled to the dummy strips 1104 and 1106 via a distributed capacitive coupling, these represented by capacitors 1302 and 1304. Since the resistors 1020 and 1022 are at the same potential, capacitive coupling there between is not important. However, although there is capacitive coupling between the resistors 1016 and 1018, and 1020 and 1022, what did not exist in the prior art was coupling from the resistors 1016 and 1018 to a centroid dummy strip. This is provided by capacitive coupling of capacitor 1308 and 1310 to dummy strip 1102.

Referring now to FIG. 14, there is illustrated a diagrammatic view of the capacitor array 206. In this embodiment, the configuration during tracking is illustrated wherein $V_{in}$ is connected from node 208 to the switch 256 and the remaining switches 258 all connected to the ground. As noted herein above, in the section 240, only the capacitors 32C through 2C are connectable to the node 208, wherein the capacitor "C" is only connectable to ground and $V_{ref}$. Due to the construction of the bridge, all capacitors from the capacitor "C" and lower, through sections 242 and 244, will result in a total effective capacitance of 2C. Therefore, the total capacitance of section 240 that is connectable to $V_{in}$ will be 62C. As will be described herein below, in addition to the capacitance 62C, there is additionally a parasitic capacitance associated therewith that must be driven by $V_{in}$.

Referring now to FIG. 15, there is illustrated a cross-sectional view of one of the capacitors. Each capacitor is comprised of two plates, one plate formed in a first Poly layer as a plate 1502, which plate 1502 is disposed a predetermined distance above a substrate 1504 and separated therefrom by an insulator. As such, there will be associated therewith a capacitance 1506, this being referred to as a parasitic capacitance, $C_p$. The capacitor is formed with a second plate 1508 separated from the first plate 1502 by a predetermined distance with a dielectric material such as silicon dioxide. This forms the sampling capacitor 1510, $C_s$. The size of this capacitor is a function of the area which can be scaled depending upon the relative ratio thereof with the unit capacitance, C. The equivalent circuit of this is illustrated in FIG. 16.

In FIG. 16, it can be seen that, when the lower plate of all of the sampling capacitors is connected to $V_{in}$, one plate of the parasitic capacitors is also connected to $V_{in}$. Therefore, $V_{in}$ must drive the parasitic capacitance associated with each capacitor that is connected thereto. If, as in conventional SAR conversion operations, $V_{in}$ were sampled across all of the capacitors, which is required for later redistribution of charge, then this $V_{in}$ would have to drive all of the capacitors in the bridge configuration.

With further reference to FIG. 14, it can be seen that section 240 has a total of 64C associated therewith and section 242 has associated therewith a total of 64C. In addition, section 244 has associated therewith a total of 16C. However, the total capacitance contribution for sections 242 and 244 due to the bridge configuration is only C. As such, to eliminate all the parasitic capacitance associated with sections 242 and 244, which would be a total of 82C, it is only necessary to drive a separate capacitor 1402 of a value of 2C that is disposed between node 204 and node 208 when connected. Thus, the parasitic capacitance for the combination of sections 244 and 242 and the lowest value capacitor C in section 240 would be replaced by a single parasitic capacitance of 2 $C_p$. This capacitor 1402, after sampling, has the lower plate thereof connected to $V_{ref}$ to redistribute the charge to the capacitors that were originally switched to ground in the sections 242 and 244 and the one capacitor in section 240.

With reference to FIG. 17, there is illustrated in a diagrammatic view the capacitor array, wherein the left side of FIG. 17 illustrates that the portion of section 240 connected to $V_{in}$ would result in a total sampling capacitance of 62C, and the total parasitic capacitance would be 62$C_p$. All that is necessary to add to this capacitance for the purpose of sampling the input voltage is 2$C_s$, which would result in a total of 2 $C_p$ added thereto.

Figure 18:
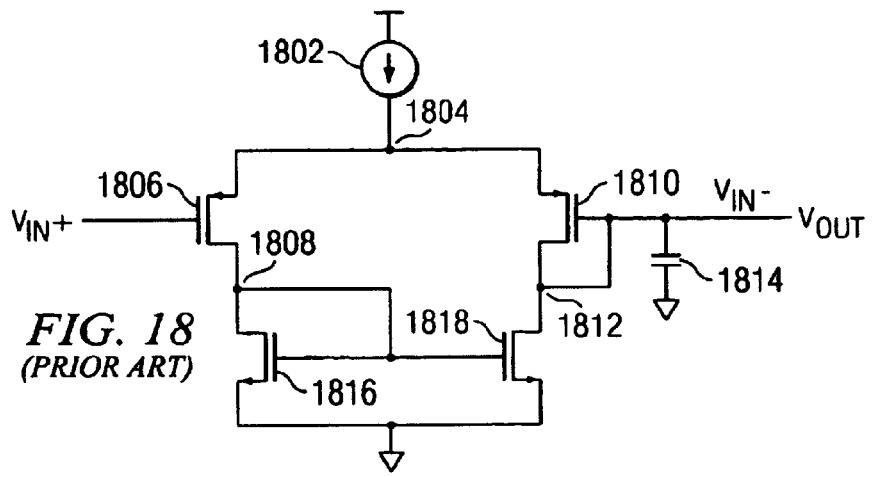
FIG. 18 and FIG. 19 illustrate prior art common mode current drivers.
Figure 19:
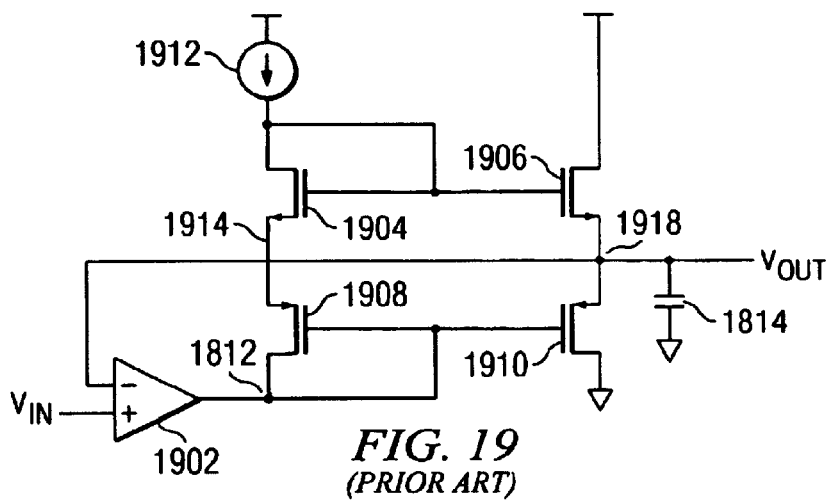
Figure 20:
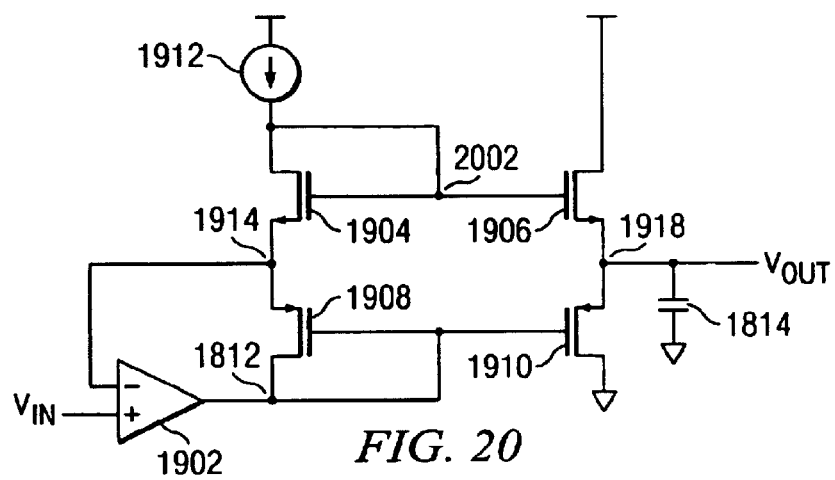
FIG. 20 illustrates the open-loop common mode driver of the present disclosure.

Referring now to FIGS. 18–20, the details of the common mode driver 222 will be described. With specific reference to FIG. 18, there is illustrated a prior art closed-loop driver, this being a fairly straightforward and conventional driver. A current source 1802 is connected between $V_{DD}$ and a common driving node 1804. Node 1804 is connected to one side of the source/drain path of a p-channel transistor 1806, the other side thereof connected to a node 1808. The gate of p-channel transistor 1806 comprises the positive input to the amplifier. The node 1804 is also connected to one side of the source/drain path of a p-channel transistor 1810, the other side thereof connected to a node 1812. The gate of transistor 1810 comprises the negative input thereof and is diode-connected to the node 1812, the node 1812 comprising the output voltage $V_{OUT}$. The output voltage $V_{OUT}$ is illustrated as being connected to one side of a capacitor 1814, the other side thereof connected to ground.

Node 1808 is connected to one side of the source/drain path of an n-channel transistor 1816, the other side thereof connected to ground and the gate thereof diode-connected to the node 1808. The node 1812 is connected to one side of the source/drain path of an n-channel transistor 1818, the other side thereof connected to ground and the gate thereof connected to the gate of transistor 1816 and node 1808.

In operation, the output driving the capacitor 1814 must drive node 1812, the $V_{OUT}$ node, through transistor 1810 when current is being sourced to the capacitor 1814. This must pass through the current source 1802 which will limit the amount of current driven thereto. If the slew rate is increased, then more power is required, since the slew rate is defined by the equation:

$$dV_{OUT}/dt = I/C_{LOAD}$$

where $C_{LOAD}$ is the capacitor 1814 and I is the current through the current source 1802.

Referring now to FIG. 19, there is illustrated a variation of the prior art embodiment of FIG. 18, with an amplifier 1902 illustrated that basically is the amplifier of FIG. 18 with the exception that the gate of transistor 1810 is not connected to the output node 1812. The positive input comprises the gate of transistor 1806 and the negative input comprises the gate of transistor 1810. The output is node 1812. This embodiment of FIG. 19 is configured with a complimentary output stage. The complimentary output stage is comprised of two n-channel transistors 1904 and 1906 and two p-channel transistors 1908 and 1910. A current source 1912 drives one side of the source/drain path of transistor 1904 from $V_{DD}$, the gate of transistor 1904 connected to the output of the current source 1912 in a diode-connected configuration. The other side of the source/drain path 1904 is connected to a node 1914, node 1914 connected to one side of the source/drain path of transistor 1908, the other side thereof connected to the node 1812. The gate of the p-channel transistor 1908 is connected to node 1812 in a diode-connected configuration. The n-channel transistor 1906 has the source/drain path thereof connected between $V_{DD}$ and an output node 1918, the gate thereof connected to the gate of transistor 1904. The p-channel transistor 1910 has the source/drain path thereof connected between the node 1918 and ground and the gate thereof connected to the gate of transistor 1908.

In operation, the voltage on node 1918 is maintained at substantially the same voltage on the $V_{IN}$ positive node of amplifier 1902. Since amplifier 1902 is a high gain amplifier, the output on node 1918 is maintained substantially equal to the input voltage. The voltage on node 1918 is mirrored to the node 1914, since the gate-to-source voltage across transistor 1906 is the same as that across transistor 1904, transistors 1904 and 1906 matched. Similarly, the gate-to-source voltage across transistor 1910 is that same as that across transistor 1908. If the voltage on node 1812 rises, this will pull the voltage on node 1914 high, which will pull the gate of transistor 1904 high which will subsequently pull node 1908 higher. This, again, is a conventional prior art complimentary output stage. In general, there is a pole at the node 1812 and a pole at the node 1918. With a large capacitive load, the pole 1918 will be the dominant pole. This will therefore require the amplifier 1902 to be very fast.

Referring now to FIG. 20, there is illustrated a schematic diagram of the open-loop driver of the present disclosure. In this embodiment, the amplifier 1902 is provided for driving the node 1812. The transistors are substantially identical for a complimentary output stage. Therefore, common numerals for like devices are utilized in the two figures. The primary difference is that the negative input to amplifier 1902, that being the gate of transistor 1810, is connected to node 1914 and not to the node 1918. Therefore, the negative input is now isolated from the node 1918 that drives the capacitor 1814. The prior art amplifier of FIG. 19 has a problem in that there is a phase shift that is a function of the capacitor value which is fed back to the negative input of amplifier 1902. As the capacitor value varies, this phase shift will vary and the bandwidth of the feedback loop varies, this providing stability problems and speed problems with the amplifier. This is only a problem where one has a large load such as that associated with a switched capacitor array wherein the capacitors are the total capacitance in the array. By isolating the feedback path from the capacitor 1814 on the output, this essentially fixes the phase shift, thus providing a known level of stability and a high speed operation even with a large capacitor array. It can be seen that the voltage on node 1914 is the same as the voltage on node 1918, as the gate-to-source voltage between node 1914 and the gate of transistor 1904 on a node 2002 is the same as the gate-to-source voltage across transistor 1906 between node 2002 and 1918. The gate-to-source voltage across transistor 1908 between nodes 1914 and 1812 is the same as the gate-to-source voltage across transistor 1910 between nodes 1812 and 1918. Thus, the voltage on node 1918 is effectively fed back to the negative input of amplifier 1902. As to the poles, node 1914 is not loaded with a large capacitor and, therefore is not necessarily the dominant pole. As such, there is no requirement for the amplifier to have a high speed operation to achieve stability.

Although the preferred embodiment has been described in detail, it should be understood that various changes, substitutions and alterations can be made therein without departing from the spirit and scope of the invention as defined by the appended claims.

What is claimed is:

1. A single ended SAR converter front end with common mode driver noise cancellation, comprising:
    a differential amplifier having positive and negative inputs and an output;
    a switched capacitor array operable in a SAR data conversion operation to vary the voltage on one of said positive or negative inputs of said differential amplifier;
    a common mode driver for delivering a low impedance common mode voltage signal to a common mode node;
    switching circuitry for switching the common mode voltage signal on said common mode node to said positive and negative inputs of said differential amplifier during a portion of a SAR data conversion cycle; and
    a capacitor reference circuit attached to the other of said positive or negative inputs of said differential amplifier during at least said portion of the SAR data conversion cycle, said capacitor reference circuit and said capacitor array during at least said portion of the SAR data conversion cycle having relative capacitance values that increase the common mode rejection of any noise introduced to said common mode node at the input of said differential amplifier.

2. The SAR converter front end of claim 1, wherein said capacitor reference circuit has associated therewith reference voltage switching circuitry for switching a reference voltage to the other of said positive and negative inputs of said differential amplifier when not operating in said portion of the SAR data conversion cycle.

3. The SAR converter front end of claim 2, wherein said reference voltage comprises ground.

4. The SAR converter front end of claim 3, wherein the SAR converter front end is fabricated on an integrated circuit and said ground reference voltage is external to said integrated circuit.

5. The SAR converter front end of claim 2, wherein said capacitor reference circuit comprises:
    a first capacitor connected between the other of said positive and negative inputs of said differential amplifier and an internal reference voltage;

a switched capacitor connected between the other of said positive and negative inputs of said differential amplifier and a switched node; and a switch for selectively switching the other end of said switch between said internal reference voltage and an external and offset ground reference voltage wherein said switch is operable to connect said switch to said external ground reference voltage during said portion of the SAR data conversion cycle and, otherwise to said internal reference voltage.

6. The SAR converter front end of claim 1, wherein the relative capacitance values are substantially equal capacitance values.

7. The SAR converter front end of claim 1, wherein said common mode rejection is maximized by said capacitor reference circuit.

8. The SAR converter front end of claim 1, wherein said capacitor reference circuitry comprises a fixed capacitor.

* * * * *